(12) United States Patent
Choi et al.

(10) Patent No.: US 7,394,193 B2
(45) Date of Patent: *Jul. 1, 2008

(54) ORGANIC ELECTROLUMINESCENCE DEVICE AND METHOD FOR FABRICATING THEREOF

(75) Inventors: Joon-Hoo Choi, Seoul (KR); Beom-Rak Choi, Seoul (KR); Chong-Chul Chai, Seoul (KR); Jin-Koo Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/515,019

(22) Filed: Sep. 1, 2006

(65) Prior Publication Data

US 2007/0063637 A1    Mar. 22, 2007

Related U.S. Application Data

(63) Continuation of application No. 10/476,398, filed as application No. PCT/KR02/00987 on May 24, 2002, now Pat. No. 7,102,281.

(30) Foreign Application Priority Data

May 25, 2001   (KR) ............................... 2001-28890

(51) Int. Cl.
   *H05B 33/00*  (2006.01)
(52) U.S. Cl. ................. 313/504; 313/506; 313/512; 445/23; 445/24
(58) Field of Classification Search ......... 313/504–506, 313/512; 428/917; 315/169.3; 445/23–25
See application file for complete search history.

(56) References Cited

U.S. PATENT DOCUMENTS

| | | | |
|---|---|---|---|
| 6,111,357 A * | 8/2000 | Fleming et al. ............. | 313/509 |
| 6,548,956 B2 | 4/2003 | Forrest et al. | |
| 6,689,492 B1 * | 2/2004 | Yamazaki et al. ........... | 428/690 |
| 6,936,846 B2 * | 8/2005 | Koyama et al. ............... | 257/71 |
| 7,098,591 B1 * | 8/2006 | Zhu et al. .................... | 313/506 |

FOREIGN PATENT DOCUMENTS

| | | |
|---|---|---|
| JP | 5-190280 | 7/1993 |
| JP | 08-162270 | 6/1996 |

(Continued)

OTHER PUBLICATIONS

Patent Abstracts of Japan, No. 08-162270, Jun. 21, 1996.

(Continued)

*Primary Examiner*—Ashok Patel
(74) *Attorney, Agent, or Firm*—MacPherson Kwok Chen & Heid LLP

(57) ABSTRACT

There are provided an organic EL device and a method of fabricating the same. An effective display area on which an anode electrode, an organic luminescence layer and a cathode electrode are formed is sealed by means of a metal can, a glass cap or an organic/inorganic material. A power source is applied to the anode and the cathode electrodes through a power transferring part extended from the effective display area to a non-effective display area. Accordingly, it is possible to reduce the oxidation of the cathode electrode of the organic EL device, thereby preventing the electrical contact characteristics of the cathode electrode from being deteriorated.

26 Claims, 9 Drawing Sheets

FOREIGN PATENT DOCUMENTS

| | | |
|---|---|---|
| JP | 11-26156 | 1/1999 |
| JP | 11-40344 | 2/1999 |
| JP | 2000-21564 | 1/2000 |
| JP | 2000-40586 | 2/2000 |
| JP | 2001-102166 | 4/2001 |

OTHER PUBLICATIONS

Patent Abstracts of Japan, No. 11-26156, Jan. 29, 1999.
Patent Abstracts of Japan, No. 11-40344, Feb. 12, 1999.
Patent Abstracts of Japan, No. 2000-21564, Jan. 21, 2000.
Patent Abstracts of Japan, No. 2001-102166, Apr. 13, 2001.
Patent Abstracts of Japan, Publication No. 05-190280, Jul. 30, 1993, 2 pp.
Patent Abstracts of Japan, Publication No. 2000-040586, Feb. 8, 2000, 1 p.
English translation of Office Action received in related Chinese Patent Application No. 02810619.9 (3 pp.).

* cited by examiner

ORGANIC ELECTROLUMINESCENCE DEVICE AND METHOD FOR FABRICATING THEREOF

CROSS-REFERENCE TO RELATED APPLICATIONS

This application is a continuation of U.S. patent application Ser. No. 10/476,398 filed Oct. 31, 2003, now U.S. Pat. No. 7,102,281 by Joon-Hoo CHOI, Beom-Rak CHOI, Chong-Chul CHAI, and Jin-Koo CHUNG entitled "ORGANIC ELECTROLUMINESCENCE DEVICE AND METHOD FOR FABRICATING THEREOF," which is based on and claims priority from International Application No. PCT/KR02/00987 filed May 24, 2002, which claims priority of Korean Patent Application No. 2001-28890 filed May 25, 2001.

TECHNICAL FIELD

The present invention relates to an organic EL (Electro Luminescence) device and a method of fabricating the same, and more particularly, to an organic EL device capable of reducing an oxidation of a cathode electrode, the cathode electrode applying a forward current to the organic EL material.

BACKGROUND ART

In these days, an organic luminescence material has been developed. The organic luminescence material has characteristics of emitting a light when a forward current is applied to two electrodes interposing the organic luminescence therebetween.

The organic luminescence material can emit a light having a red wavelength, a light having a green wavelength and a light having a blue wavelength according to the characteristics thereof.

Recently, an organic EL device has been developed by using the characteristics of the organic luminescence material. The organic EL device is lighter in weight and smaller in size than that of an LCD (Liquid Crystal Display) device.

In order to display an image in a full-color in the organic EL display device, the organic EL requires an anode electrode, a cathode electrode and an organic luminescence layer having the organic luminescence material interposed between the anode and the cathode electrodes.

The anode electrode is disposed on a transparent substrate in a matrix configuration. The number of the anode electrode is three times as many as a resolution of organic EL device. The cathode electrode 10 resolution of the organic EL device. The anode electrode is connected with a thin film transistor disposed in the matrix configuration. The anode electrode is made of a transparent conductive material such as an ITO (Indium Tin Oxide) or an IZO (Indium Zinc Oxide).

The thin film transistor includes a gate electrode, a source electrode, a drain electrode and a channel layer. The gate electrode of the thin film transistor is connected with a gate line, and the source electrode of the thin film transistor is connected with a data line.

FIG. 1 is a cross-sectional view showing a conventional organic EL device.

Referring to FIG. 1, an anode electrode 1 is connected with the drain electrode of the thin film transistor. The anode electrode I supplies holes to the organic EL material.

The organic EL material includes a Ted organic EL material 4 for emitting a light having a red wavelength, a green organic EL material 6 for emitting a light having a green wavelength and a blue organic EL material 8 for emitting a light having a blue wavelength. The red, green and blue EL materials 4, 6 and 8 are disposed on the anode electrode 1.

The cathode electrode 10 is disposed on the red, green and blue organic EL materials 4, 6 and 8 so as to supply electrons coupled to the holes provided from the anode electrode 1. The cathode electrode 10 is comprised of a pure aluminum or an aluminum alloy, and is disposed with a uniform thickness on a substrate to cover the anode electrode 1.

However, the organic EL materials 4, 6 and 8 are weak to oxygen and moisture in an atmosphere. When the organic EL materials 4, 6 and 8 are exposed to the oxygen and the moisture, a macromolecule chain of the organic EL materials 4, 6 and 8 is disconnected, or the organic EL materials 4, 6 and 8 are deteriorated because the organic EL materials 4, 6 and 8 react chemically with the oxygen and the moisture.

As a result, the organic EL materials 4, 6 and 8 cannot emit a light of required wavelength, or a life of the organic EL materials 4, 6 and 8 are rapidly reduced.

Accordingly, the organic EL materials 4, 6 and 8 should not be exposed to the oxygen and the moisture in the atmosphere when the anode electrode, cathode electrode and the organic EL materials 4, 6 and 8 are formed.

For this purpose, the organic EL materials 4, 6 and 8 are isolated from the oxygen and the moisture in the atmosphere by means of a metal can 12 and a sealant 12a. As shown in FIG. 1, a terminal part 14 of the cathode electrode 10 is not sealed by means of the metal can 12 and is exposed to the oxygen and the moisture in the atmosphere.

When the terminal part 14 of the cathode electrode 10 is exposed to the oxygen and the moisture in the atmosphere, an exposed portion of the terminal part 14 is oxidized, so that electrical characteristics of the cathode electrode 10 and display characteristics of the organic EL device are deteriorated.

DISCLOSURE OF THE INVENTION

Accordingly, the present invention has been devised to solve the foregoing problems of the conventional art, and it is a first object of the present invention to provide an organic EL device for reducing the deterioration of the electrical characteristics of a terminal part of a cathode electrode.

It is a second object of the present invention to provide a method of fabricating an organic EL device for reducing the deterioration of the electrical characteristics of a terminal part of a cathode electrode.

To accomplish the first object, there is provided an organic EL device comprising: a power supplying part for selectively supplying a power source having a predetermined level corresponding to image data; an anode electrode for receiving the power source, the anode electrode being disposed on an effective display area; an organic luminescence layer disposed on the anode electrode; a cathode electrode disposed on the organic luminescence layer corresponding to the effective display area; a power transferring part connected with the cathode electrode and extended to a non-effective display area covering the effective display area; and an insulating part disposed on the power transfer part, the insulating part partially exposed at a first portion to which the cathode electrode is connected and exposed at a second portion to which an external terminal is connected.

To accomplish the second object, there is provided a method of fabricating an organic EL device, comprising: forming a thin film transistor on an effective display area in a matrix configuration; forming a power transferring part extended from the effective display area to a non-effective display area covering the effective display area when forming the thin film transistor; forming an insulating part on the power transferring part, the insulating part partially being exposed at a first portion of the effective display area and at a second portion of the non-effective display area; forming an anode electrode on an output terminal of the thin film transistor, the anode electrode receiving the power source having a predetermined level corresponding to image data; forming an organic luminescence layer on the anode electrode, the organic luminescence layer emitting a light of a predetermined wavelength; forming a cathode electrode on the organic luminescence layer in the effective display area, the cathode electrode being electrically connected with the power transferring part; and forming a shielding part for sealing the effective display area.

BRIEF DESCRIPTION OF THE DRAWINGS

The above objects and other advantages of the present invention will become more apparently by describing in detail the preferred embodiments thereof with reference to the accompanying drawings, in which.

BEST MODE FOR CARRYING OUT THE INVENTION

Hereinafter, preferred embodiments are described with reference to the accompanying drawings.

Figure 1:
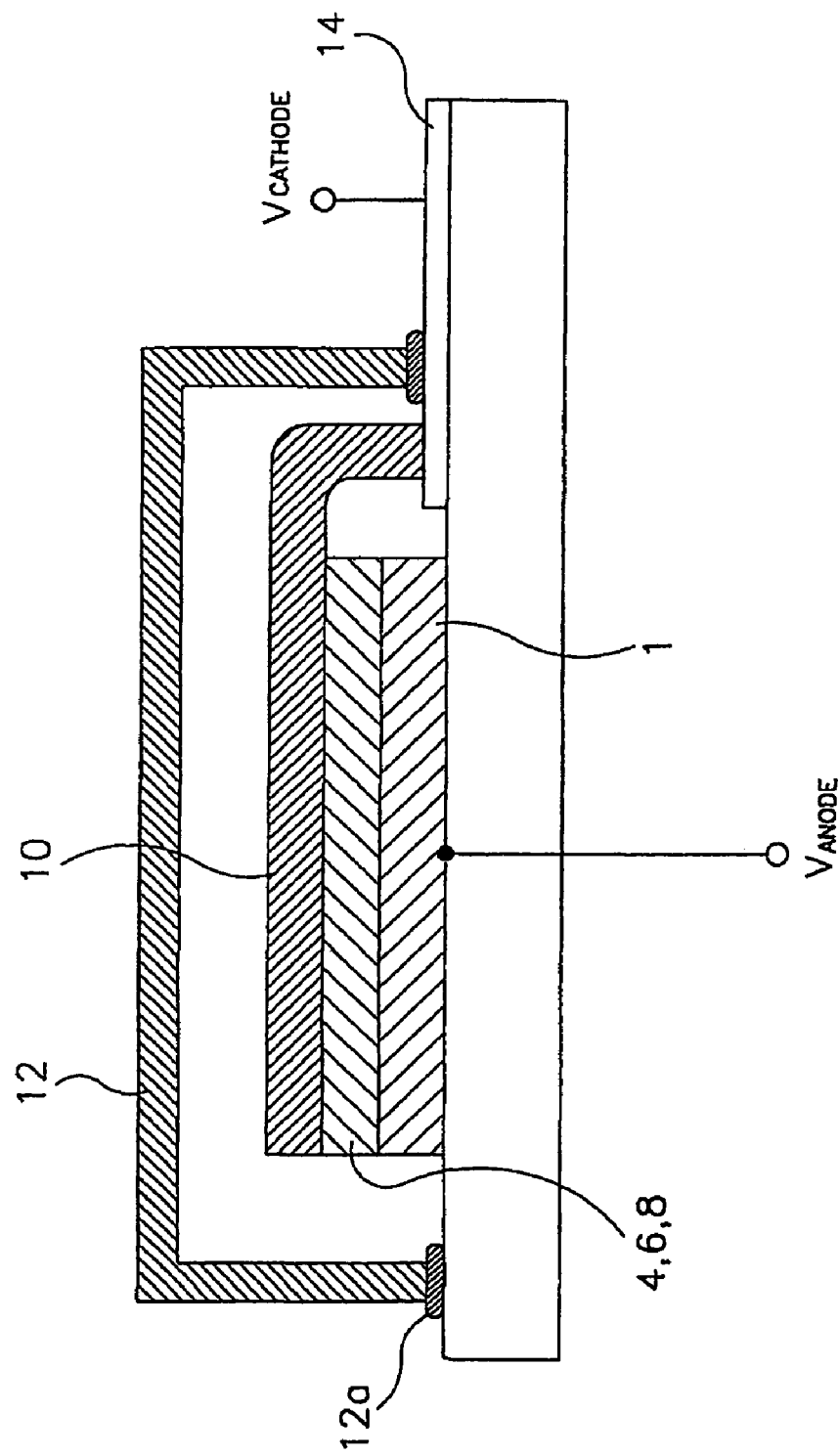
FIG. 1 is a schematic view showing a conventional organic EL device.
Figure 2:
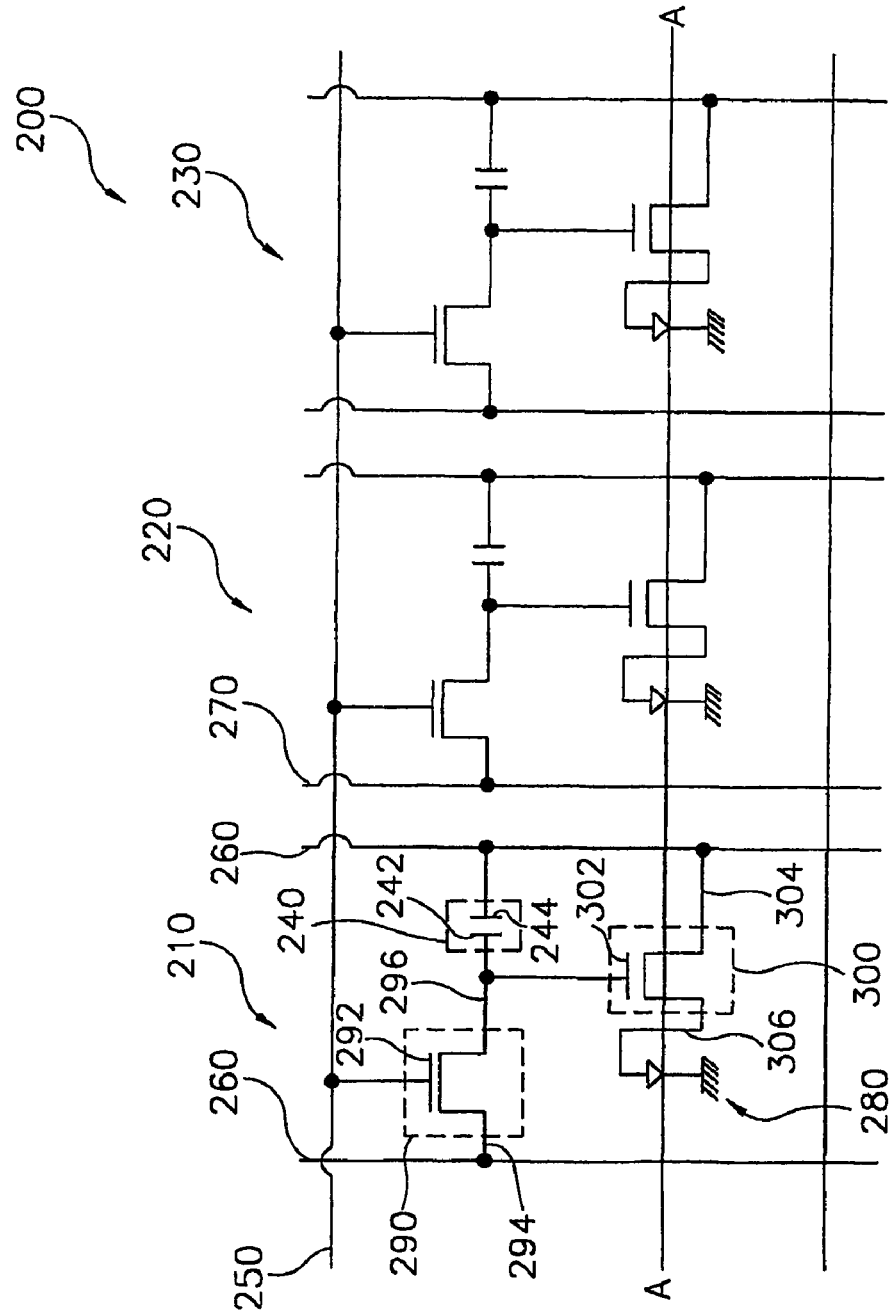
FIG. 2 is a circuit diagram showing an organic EL device according to one preferred embodiment of the present invention.

FIG. 2 is a circuit diagram showing an organic EL device according to the present invention.

Referring to FIG. 2, an organic EL device 200 includes a plurality of organic EL elements 210, 220 and 230. In the present embodiment, one organic EL element 210 among three organic EL elements 210, 220 and 230 will be described.

The organic EL element 210 includes two TFTs 290 and 300, an image maintaining capacitor 240, driving signal lines 250, 260 and 270, and a pixel 280.

A first thin film transistor 290 indicates a switching transistor, and a second thin film transistor 300 indicates a driving transistor.

The driving signal line referred to as a reference numeral 250 indicates a gate line connected with a gate electrode 292 of the switching transistor 290. The driving signal line referred to as a reference numeral 260 indicates a data line connected with a source electrode of the switching transistor 290. The data line is perpendicular to the gate line 250. The driving signal line referred to, as a reference numeral 270 indicates a bias line parallel to the data line 260.

The switching transistor 290 is formed in an internal area that the gate line 250 is intersected with the data line 260.

The gate electrode 292 of the switching transistor 290 is connected with the gate line 250, and the source electrode 294 of the switching transistor 290 is connected with the data line 260.

The drain electrode 296 of the switching transistor 290, which is operated as an output terminal, is connected with a first electrode 242 of the image maintaining capacitor 240, and simultaneously connected with a gate electrode 302 of the driving transistor 300 in parallel.

A second electrode 244, which is opposite to the first electrode 242 of the image maintaining capacitor 240, and a source electrode 304 of the driving transistor 300 are connected with a bias line 270 to which a predetermined power source is applied. A drain electrode 306 of the driving transistor 300 is connected with the pixel 280.

A predetermined power source is applied to all data line 260 sequentially. The first gate line 250 receives a power source that has enough voltage to turn on the switching transistor 290 for a short period. The channel layer of the switching transistor 290 remains as a conduction state according as the power source is applied to the gate line. The power source applied to the data line 260 is output to the drain electrode 296 of the switching transistor 290 through the source electrode 294 and the channel layer (not shown) thereof.

The power source applied to the drain electrode 296 of the switching transistor 290 is applied output through two paths.

Firstly, the power source is output to the first electrode 242 of the image maintaining capacitor 240. Since the second electrode 244 of the image maintaining capacitor 240 has already received the power source, the image maintaining capacitor 240 is charged with electrical charges when the first electrode 242 receives the power source.

Secondly, the power source is output to the gate electrode 302 of the driving transistor 300. Since the source electrode 304 of the driving transistor 300 has already received the power source from the bias line 270, the power source applied to the source electrode 304 is output to the drain electrode 306 through the channel layer when the power source is applied to the gate electrode 302 of the driving transistor 300. The power source output to the drain electrode 306 is applied to the pixel 280.

The switching transistor 290 supplies the power source to the gate electrode 302 of the driving transistor 300 during applying the power source to the gate line 250.

However, when the switching transistor 290 is turned off, the image maintaining capacitor 240 is discharged. Accordingly, the driving transistor 300 turns on for a period of a frame of an image.

The power source output from the drain electrode 306 of the driving transistor 300 is applied to the pixel 280.

Figure 3:
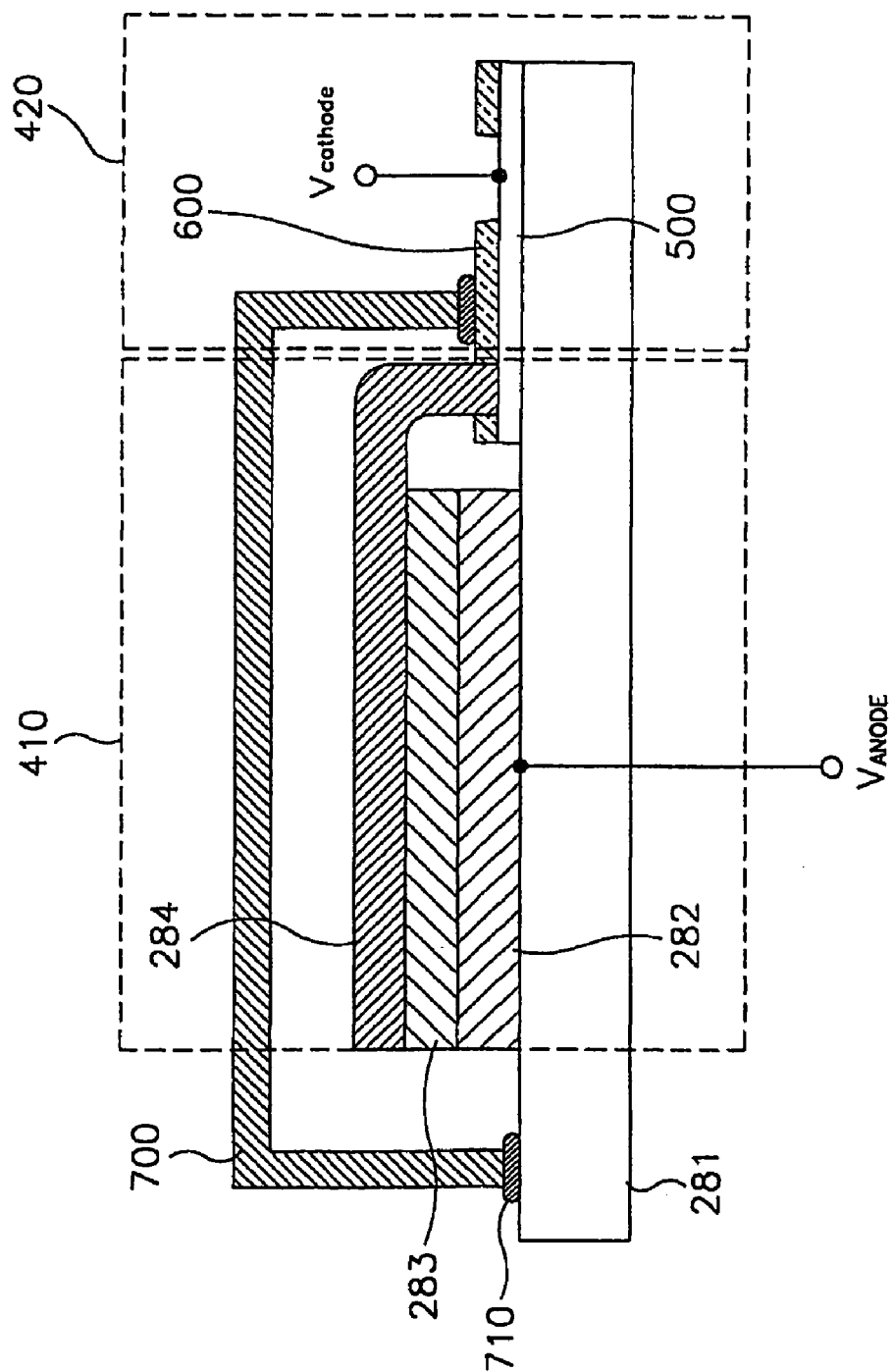
FIG. 3 is a schematic view showing a profile of the organic EL device according to one preferred embodiment of the present invention.

FIG. 3 is a schematic view showing a profile of the organic EL device according to the present invention.

Referring to FIG. 3, the pixel 280 includes a transparent conductive anode electrode 282, an organic luminescence layer 283 formed on the upper surface of the anode electrode 282, a cathode electrode 284 formed over the organic luminescence layer 283 with a uniform thickness, and a power transferring part 500.

Reference numerals "410" and "420" indicate an effective display area and a non-effective display area, respectively. The image is displayed through the effective display area.

The anode electrode 282, the organic luminescence layer 283 and the cathode electrode 284 are disposed in the effective display area 410. The effective display area 410 is encapsulated by means of the sealing cap to prevent the effective display area 410 from being deteriorated by the oxygen or the moisture. The cathode electrode 284 is not oxidized because the cathode electrode 284 is sealed by means of the sealing cap 700.

However, when the cathode electrode 284 is isolated from the oxygen or the moisture by means of the sealing cap 700, the power source from the non-effective area cannot be applied to the cathode electrode 284. For example, the sealing cap 700 may be a metal can.

The power source may be applied to the isolated cathode electrode 284 through the power transferring part 500.

A first end of the power transferring part 500 is disposed on the effective display area 410 and a second end opposite to the first end of the power transferring part 500 is disposed on the non-effective display area 420.

Particularly, the first end of the power transferring part 500 is connected with the cathode electrode 284 disposed in the effective display area 410, and the second end of the power transferring part 500 is connected with the external terminal (not shown) disposed in the non-effective display area.

The power transferring part 500 is covered by means of an insulating thin film 600 except two portions of the power transferring part 500. A first portion of the power transferring part 500 is a portion that is connected with the external terminal, and the second portion of the power transferring part 500 is a portion that is connected with the cathode electrode 284. For example, the power transferring part 500 may be a conductive film.

The insulating thin film 600 reduces the oxidization of the power transferring part 500.

FIGS. 4 to 9 are cross-sectional views showing an organic EL device according to the present invention.

Figure 4:
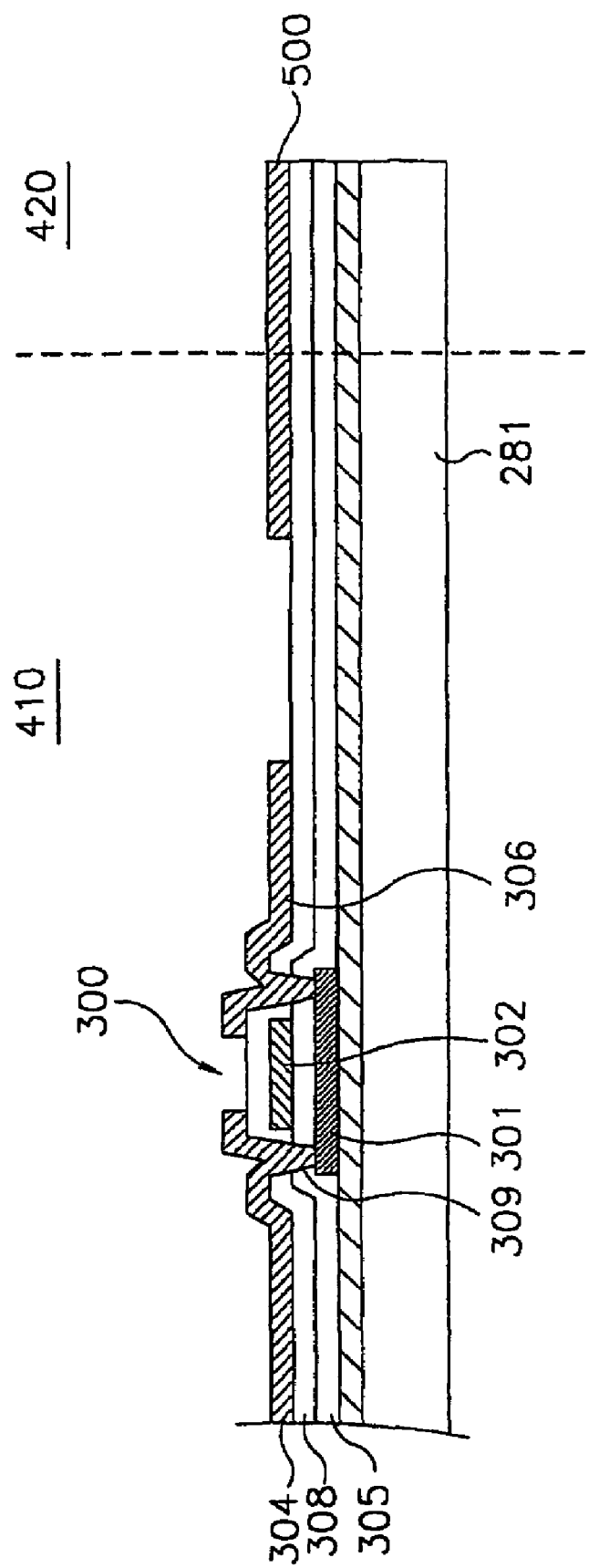
FIG. 4 is a cross-sectional view showing a thin film transistor of the organic EL device according to one preferred embodiment of the present invention.

FIG. 4 is a cross-sectional view showing a thin film transistor of the organic EL device according to the present invention.

Referring to FIG. 4, the switching thin film transistor and the driving thin film transistor are formed on the substrate 281 in the matrix configuration.

In FIG. 4, the driving thin film transistor 300 is shown.

The driving thin film transistor 300 includes a channel layer 301, a first insulating layer 305, a gate electrode 302, a second insulating layer 308, a contact hole 309, a source electrode 304 and a drain electrode 306. Processes for forming the driving thin film transistor 300 are the same as that of the switching thin film transistor, so that the switching thin film transistor has the driving thin film transistor 300.

The driving thin film transistor 300 is formed on the substrate 281 in the effective display area 410.

The channel layer 301 is formed by depositing an amorphous silicon layer on the substrate 281 and by patterning the amorphous silicon layer by means of a photolithography process. Amorphous silicon doped by n+ ions may be used instead of the amorphous silicon.

The first insulating layer 305 is formed over the substrate 281 to cover the channel layer 301.

After forming a gate metal layer on the first insulating layer 305, the gate metal layer is patterned to form the gate electrode 302. The gate electrode 302 is disposed on the portion, which corresponds to the upper surface of the channel layer 301, of the first insulating layer 305. In the process of forming the gate electrode 302, the power transferring part 500 may be formed. For example, the gate electrode 302 and the power transferring part 500 may be formed simultaneously.

The second insulating layer 308 insulates the gate electrode 302. For this purpose, the second insulating layer 308 is formed over the substrate 281.

The contact hole 309 is formed by partially etching the first and the second insulating layers 305 and 308 via a photolithography process. The contact hole 309 is placed at both sides of the gate electrode 302, which is adjacent to the gate electrode 302. The channel layer 301 is exposed through the contact hole 309.

The source and the drain electrodes 304 and 306 are formed via patterning a source/drain metal deposited on the second insulating layer 308.

In the process of forming the source and the drain electrode 304 and 306, the power transferring part 500 may be formed, which is extended from the effective display area 410 to the non-effective display area 420. For example, the source electrode and the drain electrode 304, 306, and the power transferring part 500 may be formed simultaneously.

Figure 5:
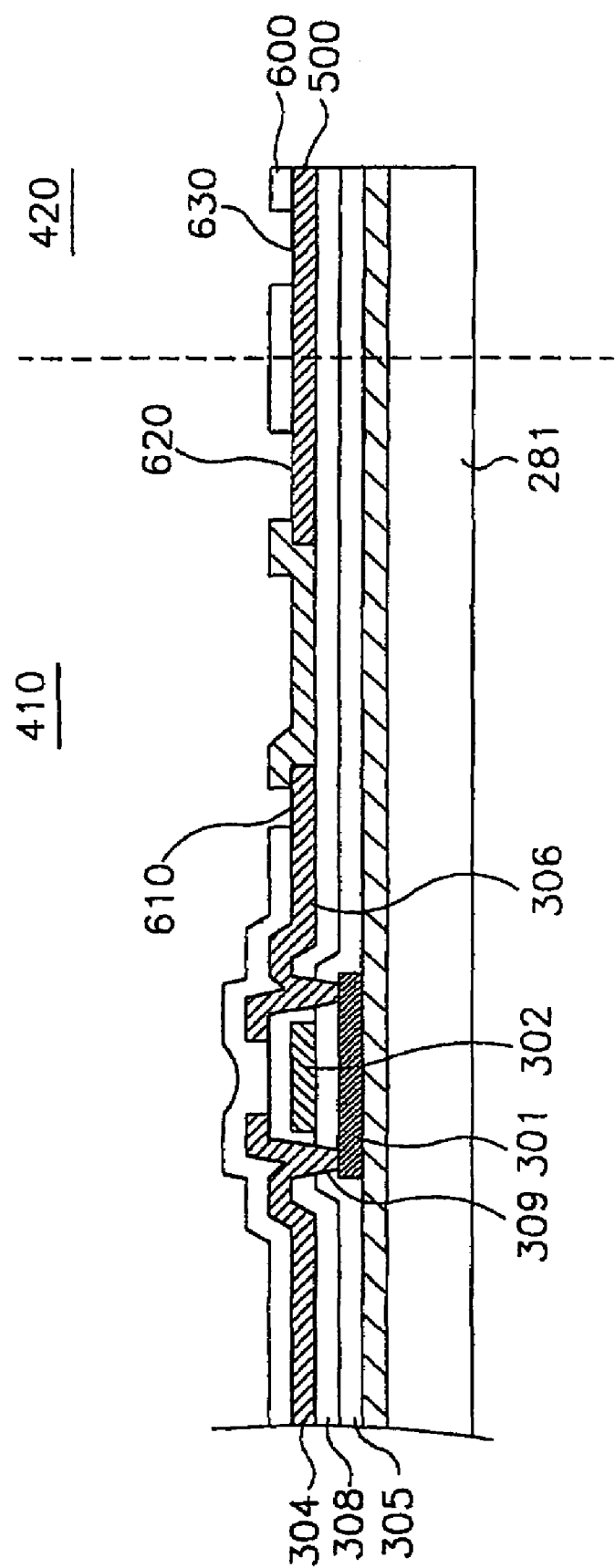
FIG. 5 is a cross-sectional view showing a third insulating layer of the organic EL device according to one preferred embodiment of the present invention.

FIG. 5 is a cross-sectional view showing a third insulating layer of the organic EL device according to the present invention.

Referring to FIG. 5, the third insulating layer 600 is formed on the substrate 281 to cover the driving thin film transistor 300 and the power transferring part 500.

The third insulating layer 600 is patterned to form contact holes 610, 620 and 630, the contact hole 610 is formed on a portion of the drain electrode 306, the contact hole 620 is formed on the effective display area of the power transferring part 500, and the contact holes 630 is formed on the non-effective display areas of the power transferring part 500.

Figure 6:
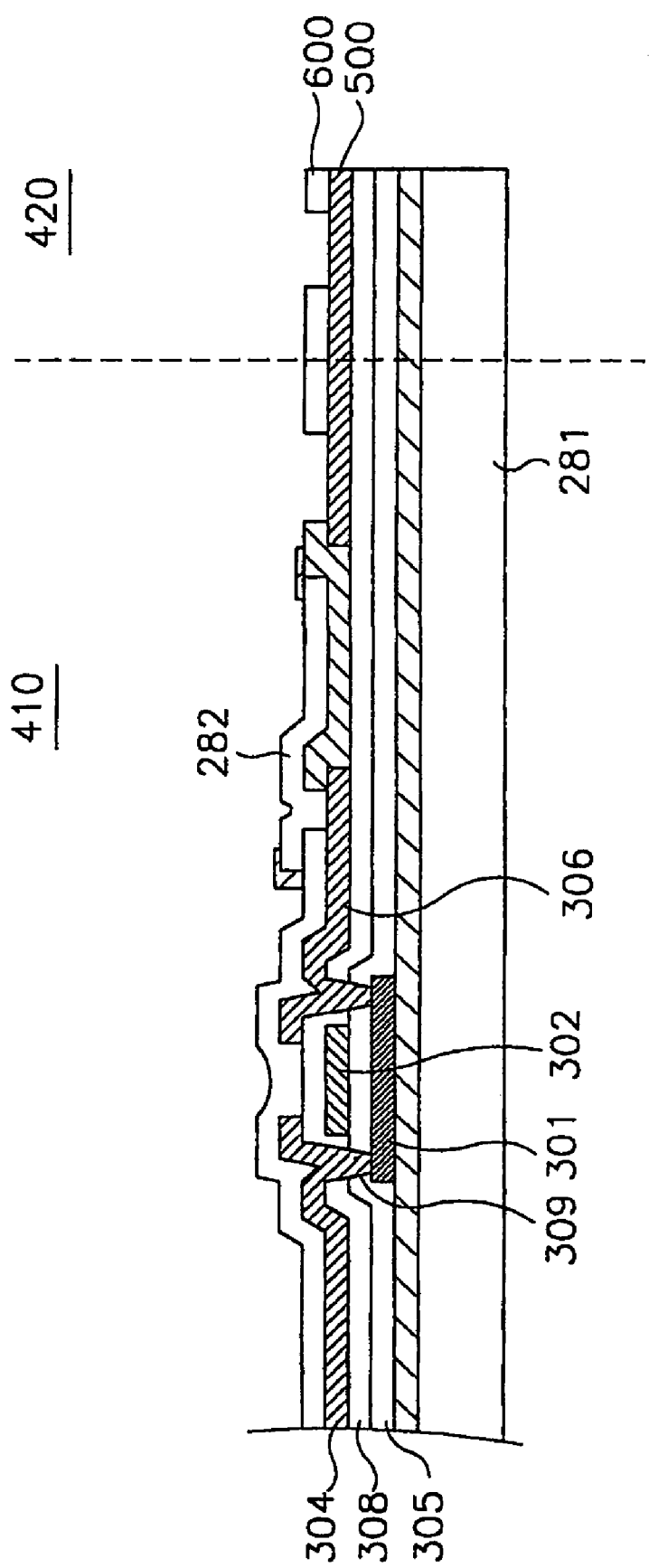
FIG. 6 is a cross-sectional view showing an anode electrode of the organic EL device according to one preferred embodiment of the present invention.

FIG. 6 is a cross-sectional view showing an anode electrode of the organic EL device according to the present invention.

Referring to FIG. 6, in order to form the anode electrode 282, a thin film made of the ITO or the IZO is deposited on the third insulating layer 600. The thin film is patterned to form the anode electrode 282, and the anode electrode 282 is connected with the drain electrode 306.

Figure 7:
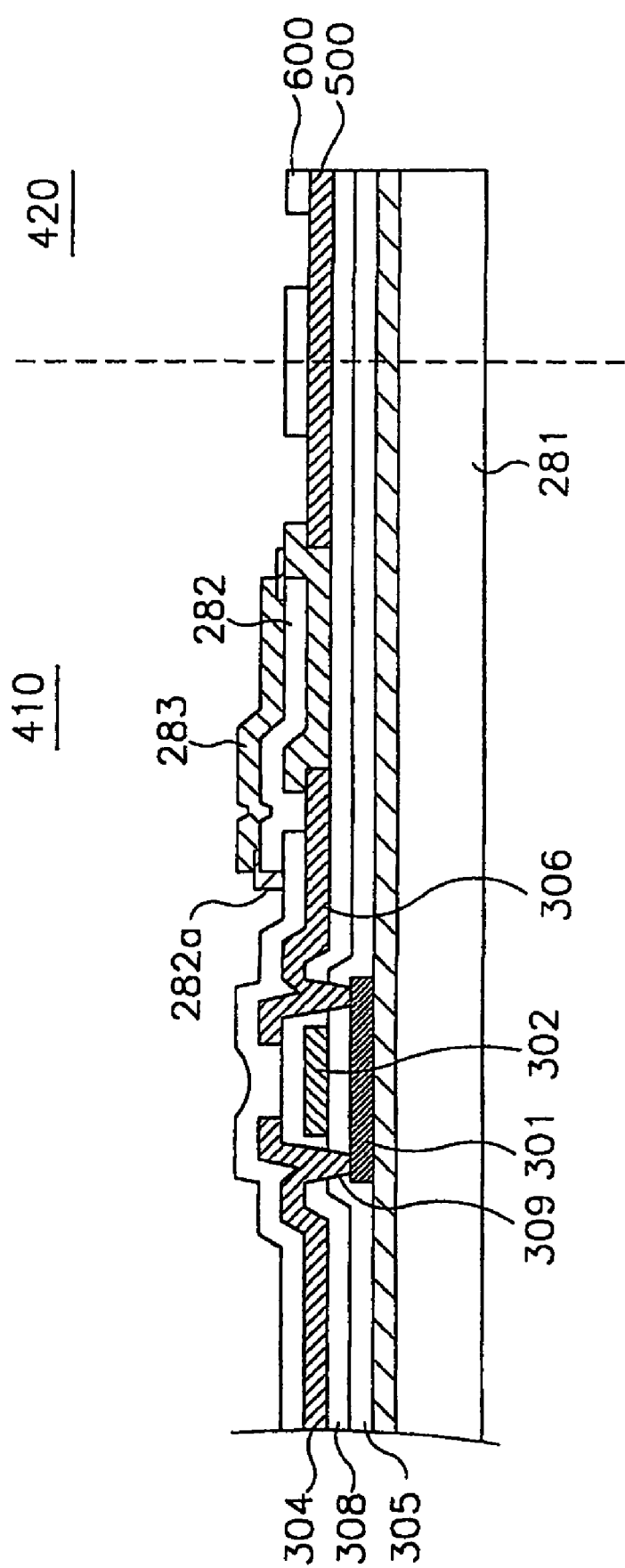
FIG. 7 is a cross-sectional view showing an organic luminescence layer of the organic EL device according to one preferred embodiment of the present invention.

FIG. 7 is a cross-sectional view showing an organic luminescence layer of the organic EL device according to the present invention.

Referring to FIG. 7, the organic luminescence layer 283 is partially formed on, the anode electrode 282. The organic luminescence layer 283 includes the red organic luminescence for emitting the light having the red wavelength, the green organic luminescence for emitting the light having the green wavelength or the blue organic luminescence for emitting the light having the blue wavelength. The reference numeral "282a" is an organic wall wrapping an edge portion of the anode electrode 282 as shown in FIG. 7.

Figure 8:
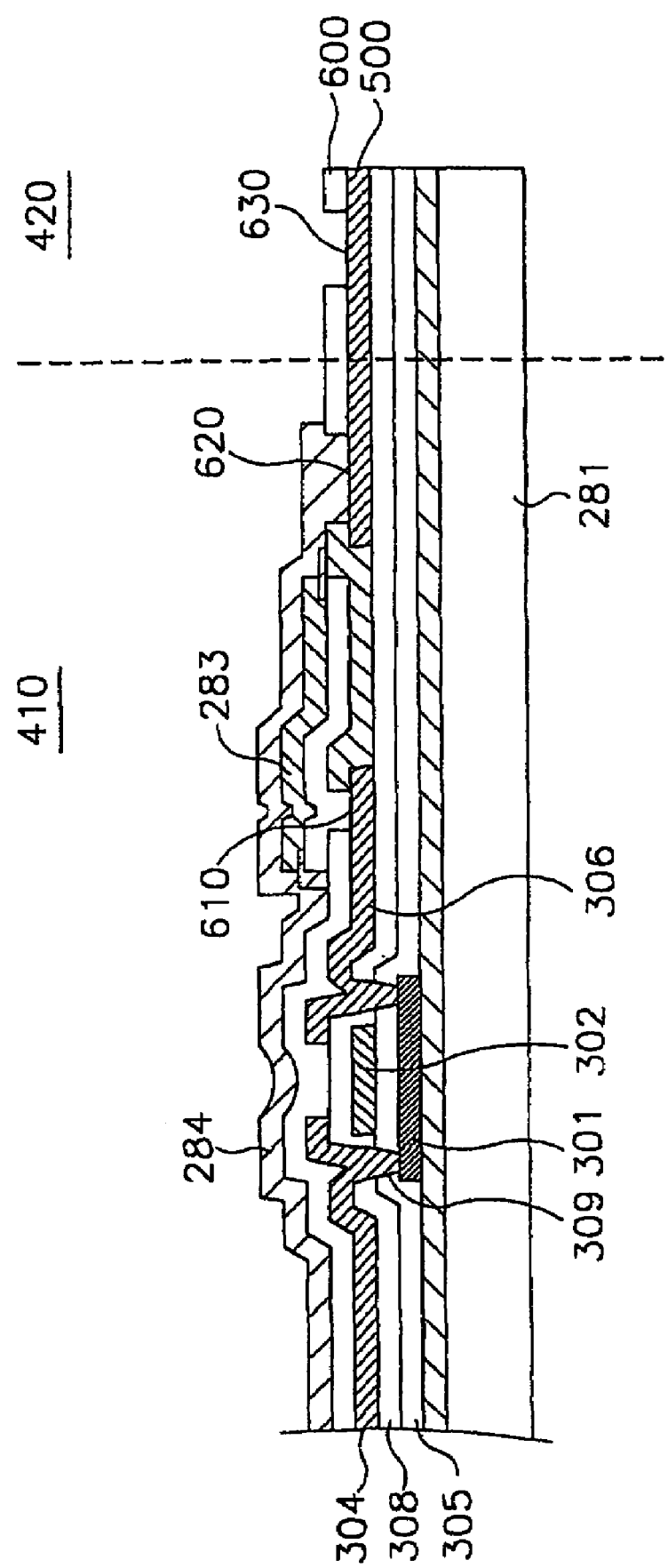
FIG. 8 is a cross-sectional view showing a cathode electrode of the organic EL device according to one preferred embodiment of the present invention.

FIG. 8 is a cross-sectional view showing a cathode electrode of the organic EL device according to the present invention.

Referring to FIG. 8, the cathode electrode 284 is formed on the upper surface of the substrate 281 under the effective display area 410 to cover the organic luminescence layer 283.

The cathode electrode 284 is connected with the organic luminescence layer 283 and simultaneously connected with the contact hole 620 of the third insulating layer 600, the power transferring part 500 being exposed through the contact hole 620.

Figure 9:
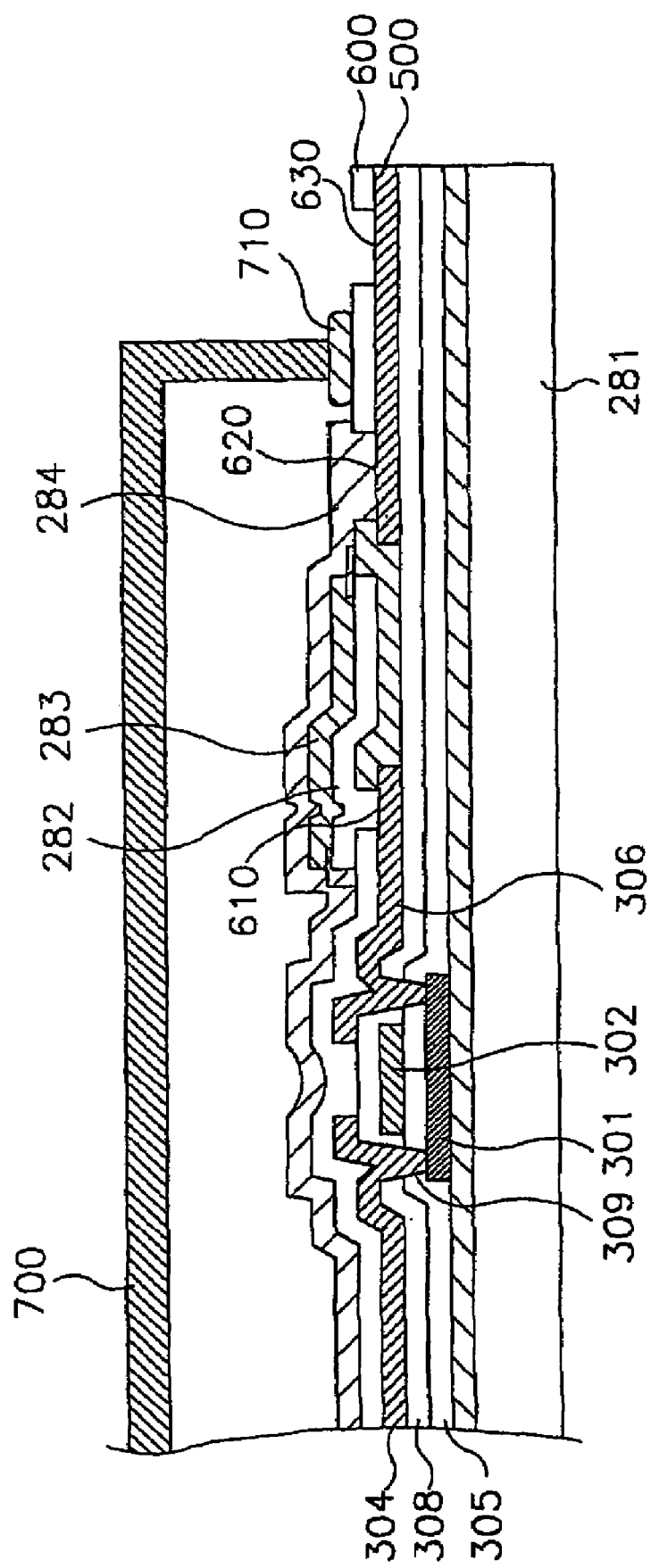
FIG. 9 is a cross-sectional view showing a sealing cap of the organic EL device according to one preferred embodiment of the present invention.

FIG. 9 is a cross-sectional view showing a sealing cap of the organic EL device according to the present invention.

Referring to FIG. 9, the sealing cap 700 is formed to seal the effective display area 410 by means of a sealant 710. For example, the sealing cap 700 may be a metal can.

Hereinafter, referring to FIGS. 2 and 3, the method for displaying the image by means of the organic EL device will be described.

The data line 260 receives a predetermined power source. The gate line 250 receives a power source having a voltage level higher than a threshold voltage for the switching transistor 290.

Thus, the power source applied to the data line 260 is applied to the drain electrode 296 of the switching transistor 290 through the source electrode 294 and the channel layer of the switching transistor 290.

Next, the power source applied to the drain electrode 296 of the switching transistor 290 charges the image maintaining capacitor 240, and simultaneously applies a power source having a voltage level higher than the threshold voltage to the gate electrode 302 of the driving transistor 300.

The power source having the voltage level higher than the threshold voltage is applied to the gate line 250 for a short period. When it is stopped to apply the power source to the drain electrode 296 of the switching transistor 290, electric charges charged into the image maintaining capacitor 240 is discharged.

Accordingly, the power source charged into the image maintaining capacitor 240 is applied as a turn on voltage to the gate electrode 302 of the driving transistor 300 during a time corresponding to a frame. As a result, the anode electrode 282 receives a predetermined current from the bias line 270 while the image maintaining capacitance 540 is in a discharge state.

The power source $V_{cathode}$ supplied from the external terminal is supplied to the effective display area 410 from the non-effective display area 420 through the power transferring part 500. The $V_{cathode}$ applied to effective display area 410 is applied to the cathode electrode 284. For example, a common voltage may be applied to the power transferring part 500.

Thus, the cathode electrode 284 supplies the electrons to the organic luminescence layer 283, and the anode electrode 583 continuously supplies the holes. As a result, an energy level change, which is caused by bonding the electrons and the holes, occurs in the organic luminescence layer 283.

The light having the red wavelength, the light having the green wavelength and the light having the blue wavelength are emitted based on properties of the organic luminescence layer 283.

The light having the red wavelength, the light having the green wavelength and the light having the blue wavelength are provided to the user through the anode electrode 282 and the transparent substrate 281, thereby displaying a required image.

INDUSTRIAL APPLICABILITY

As described previously, the cathode electrode is formed only on the effective display area sealed by means of the sealing cap such as the metal can. Also, the power source for the cathode electrode is applied through the power transferring part extended from the effective display area to the non-effective display area. Accordingly, it is possible to reduce the oxidation at the cathode electrode of the organic EL device, thereby preventing the electrical contact characteristics of the cathode electrode from being deteriorated.

This invention has been described above with reference to the aforementioned embodiments. It is evident, however, that many alternative modifications and variations will be apparent to those having skills in the art in light of the foregoing description. Accordingly, the present invention embraces all such alternative modifications and variations as fall within the spirit and scope of the appended claims.

The invention claimed is:

1. An organic electro luminescence device comprising;
   an anode electrode only being disposed in an effective display area;
   an organic luminescence layer disposed on the anode electrode;
   a cathode electrode disposed on the organic luminescence layer;
   a conductive film connected with the cathode electrode, and extending to a non-effective display; and
   an insulating part disposed on the overall conductive film and having contact holes formed through the insulating part.

2. The organic electro luminescence device of claim 1, wherein the conductive film is partially exposed at a first portion to which the cathode electrode is connected and partially exposed at a second portion.

3. The organic electro luminescence device of claim 1, wherein a common voltage is applied to the conductive film.

4. The organic electro luminescence device of claim 1, further comprising:
   a gate electrode;
   a gate insulating layer contacting the gate electrode;
   a semiconductor layer contacting the gate insulating layer; and
   a source electrode and a drain electrode each contacting the semiconductor layer, the drain electrode being connected with the anode electrode.

5. The organic electro luminescence device of claim 4, wherein the conductive film is simultaneously formed with the gate electrode.

6. The organic electro luminescence device of claim 4, wherein the conductive film is simultaneously formed with the source electrode and the drain electrode.

7. The organic electro luminescence device of claim 1, wherein the effective display area is surrounded by a sealing cap.

8. A method of fabricating an organic electro luminescence device, comprising:
   forming an anode electrode only in an effective display area;
   forming an organic electro luminescence layer on the anode electrode;
   forming a conductive film connected with the cathode electrode and extended to a non-effective display area;
   forming a cathode electrode on the organic electro luminescence layer;
   forming an insulating part on the overall conductive; and
   forming contact holes through the insulating part.

9. The method of claim 8 further comprising partially exposing the conductive film at a first portion to which the cathode electrode is connected and at a second portion to which an external terminal is connected.

10. The method of claim 8, further comprising:
    forming a gate electrode;
    forming a gate insulating layer contacting the gate electrode;
    forming a semiconductor layer contacting the gate insulating layer; and forming a source electrode and a drain electrode each contacting the semiconductor layer, the drain electrode being connected with the anode electrode.

11. The method of claim 10, wherein the conductive film is simultaneously formed with the gate electrode.

12. The method of claim 10, wherein the conductive film is simultaneously formed with the source electrode and the drain electrode.

13. The method of claim 8, further comprising forming a shielding part for sealing the effective display area.

14. An organic electro luminescence device comprising;
an anode electrode only being disposed in an effective display area;
an organic electro luminescence layer disposed on the anode electrode;
a cathode electrode disposed on the organic electro luminescence layer;
a conductive film connected with the cathode electrode and extending to a non-effective display area;
an insulating part disposed on the conductive film; and
a sealant disposed on the insulating part.

15. The organic electro luminescence device of claim 14, wherein the conductive film is partially exposed at a first portion to which the cathode electrode is connected, and partially exposed in the non-effective display area.

16. The organic electro luminescence device of claim 14, wherein a common voltage is applied to the conductive film.

17. The organic electro luminescence device of claim 14, further comprising:
a gate electrode;
a gate insulating layer contacting the gate electrode;
a semiconductor layer contacting the gate insulating layer; and
a source electrode and a drain electrode each contacting the semiconductor layer, the drain electrode being connected with the anode electrode.

18. The organic electro luminescence device of claim 17, wherein the conductive film is simultaneously formed with the gate electrode.

19. The organic electro luminescence device of claim 17, wherein the conductive film is simultaneously formed with the source electrode and the drain electrode.

20. The organic electro luminescence device of claim 14, wherein the effective display area is surrounded by a sealing cap, the sealing cap having an edge contacting the sealant.

21. A method of fabricating an organic electro luminescence device, comprising:
forming an anode electrode only in an effective display area;
forming an organic electro luminescence layer on the anode electrode;
forming a cathode electrode on the organic electro luminescence layer
forming a conductive film connected with the cathode electrode and extending to a non-effective display area;
forming an insulating part on the conductive film; and
forming a sealant on at least a portion of the insulating part.

22. The method of claim 21, further comprising partially exposing the conductive film at a first portion to which the cathode electrode is connected and at a second portion in the non-effective display area.

23. The method of claim 21, further comprising:
forming a gate electrode;
forming a gate insulating layer contacting the gate electrode;
forming a semiconductor layer contacting the gate insulating layer; and
forming a source electrode and a drain electrode each contacting the semiconductor layer, the drain electrode being connected with the anode electrode.

24. The method of claim 23, wherein the conductive film is simultaneously formed with the gate electrode.

25. The method of claim 23, wherein the conductive film is simultaneously formed with the source electrode and the drain electrode.

26. The method of claim 21, further comprising forming a shielding part for sealing the effective display area.

* * * * *